United States Patent [19]
Orihira et al.

[11] Patent Number: 5,685,363
[45] Date of Patent: Nov. 11, 1997

[54] SUBSTRATE HOLDING DEVICE AND MANUFACTURING METHOD THEREFOR

[75] Inventors: Koichi Orihira; Yasunori Ando; Hiroshi Inami, all of Kyoto, Japan

[73] Assignee: Nissin Electric Co., Ltd., Kyoto, Japan

[21] Appl. No.: 568,767

[22] Filed: Dec. 7, 1995

[30] Foreign Application Priority Data

Dec. 8, 1994 [JP] Japan ................... 6-331948

[51] Int. Cl.$^6$ ................ C23C 14/50; F28F 23/00
[52] U.S. Cl. ............. 165/46; 165/80.1; 165/80.4; 165/185; 165/104.19; 165/80.5; 118/724; 29/890.03
[58] Field of Search ................ 165/46, 104.19, 165/80.4, 80.5, 185, 80.1; 118/724, 725, 728

[56] References Cited

U.S. PATENT DOCUMENTS

| | | | |
|---|---|---|---|
| 4,682,566 | 7/1987 | Aitken | 118/724 |
| 4,993,482 | 2/1991 | Dolbear et al. | 165/80.2 |
| 4,997,032 | 3/1991 | Danielson et al. | 165/46 |

FOREIGN PATENT DOCUMENTS

| | | | |
|---|---|---|---|
| 55-44673 | 3/1980 | Japan | 165/104.19 |
| 61-58260 | 3/1986 | Japan | 165/185 |
| 329758 | 5/1930 | United Kingdom | 165/185 |

*Primary Examiner*—Allen J. Flanigan
*Attorney, Agent, or Firm*—Finnegan, Henderson, Farabow, Garrett & Dunner, L.L.P.

[57] ABSTRACT

A substrate holding device of the invention includes a base cooled with a heat absorbing fluid, a flexible sheet being extended on a surface of the base for forming a sealed portion between the sheet and the base, a heat absorbing fluid with which the sealed portion is filled, a sheet-like rubber elastic material being disposed on the sheet, and a substrate retainer for pressing fringes of a substrate, placed on the rubber elastic material, against the base. Metal elastic members may be distributed almost uniformly in the sealed portion, in place of or together with, the rubber elastic material.

17 Claims, 6 Drawing Sheets

SUBSTRATE HOLDING DEVICE AND MANUFACTURING METHOD THEREFOR

BACKGROUND OF THE INVENTION

1. Field of the Invention

This invention relates to a substrate holding device used when particles having energy, such as, ion beams, plasma, or electron beams, are made incident on a substrate in a vacuum or any other atmosphere as in an ion implanter, an ion doping system (ion implanter or non-mass separation type), a sputtering system, a dry etching system, an electron beam irradiation system, etc., and more particularly to means for improving a cooling capability for the substrate.

2. Description of the Related Art

Various substrate holding devices have been proposed which suppress a temperature rise of a substrate caused by power input thereto by ion beams, plasma, etc., when treatment, such as, ion implantation or etching, is applied to the surface of the substrate, such as, a semiconductor substrate or liquid crystal display glass substrate.

FIG. 13 shows one example of the conventional substrate holding devices. The substrate holding device is provided with a base 4 for supporting a substrate 2, etc., a flexible sheet 12 extended so as to cover a recess 10 formed on the surface of base 4 and to form a sealed portion 16 between sheet 12 and base 4, a heat absorbing fluid 18 with which sealed portion 16 is filled, and an annular substrate retainer 20 for pressing the fringes of substrate 2 placed on sheet 12 against base 4. When sealed portion 16 is filled with heat absorbing fluid 18 and provides a proper pressure, sheet 12 swells, as shown in FIG. 13, and, even when substrate 2 is mounted, remains swelled to a certain degree.

Sheet 12 is an extra-thin sheet made of, for example, fluororesin, polyimide, etc. The fringes of sheet 12 are bonded to base 4 for sealing and are further mounted by means of a sheet retainer 14 in order to improve the fixation strength. Substrate 2 is pressed against sheet 12 by substrate retainer 20, whereby sheet 12 comes into intimate contact with the rear face of substrate 2.

In this example, base 4 contains a heat absorbing fluid passage 6 into which heat absorbing fluid 18, such as water or chlorofluorocarbon, flows in order to cool base 4.

A treatment is applied to substrate 2 in such a manner that substrate 2 is irradiated with, for example, an ion beam, through an opening of substrate retainer 20 in a vacuum environment. Although heat is applied to substrate 2 by irradiation with the ion beam, etc., the heat flows to base 4, via sheet 12 and heat absorbing fluid 18, from substrate 2, and further is conveyed away by heat absorbing fluid 8. Thus, substrate 2 may be cooled.

With the conventional substrate holding device, flexible sheet 12 is brought into intimate contact with the rear face of substrate 2, whereby the contact area with substrate 2 is increased, as compared to the case where substrate 2 is brought into direct contact with base 4. Therefore, heat conduction from substrate 2 to base 4 may still be improved. Thus, a substrate holding device having an improved cooling capability is needed in order to reduce the rise in temperature of substrate 2.

SUMMARY OF THE INVENTION

It is an object of the invention to provide a substrate holding device which improves thermal conduction from a substrate to a base so to enhance the cooling capability for the substrate, and a manufacturing method therefor.

A substrate holding device is comprised of a base for holding a substrate; a sealed portion provided on the base, at least part of the sealed portion being flexible; a heat absorbing fluid with which the sealed portion is filled; a sheet-shaped rubber elastic material being disposed on the sealed portion; and a substrate retainer for pressing fringes of the substrate placed on the substrate holding device against the base. Metal elastic members may be distributed almost uniformly in the sealed portion in place of or together with the rubber elastic material.

In the present invention, the thermal conduction from the substrate to the base is improved, and thus, the cooling capability for the substrate is enhanced by installing the rubber elastic material. Alternatively, the thermal conduction from the substrate to the base is improved, enhancing the cooling capability for the substrate, by housing the metal elastic members in the sealed portion filled with the heat absorbing fluid. If the rubber elastic material and the metal elastic members are used together, the thermal conduction between the base and both the sheet and the heat absorbing fluid are improved. Thus, the thermal conduction between the substrate and the base is also improved, which enhances the cooling capability for the substrate.

PREFERRED EMBODIMENTS OF THE INVENTION

Referring now to the accompanying drawings, the preferred embodiments of the present invention will be described.

Figure 1:
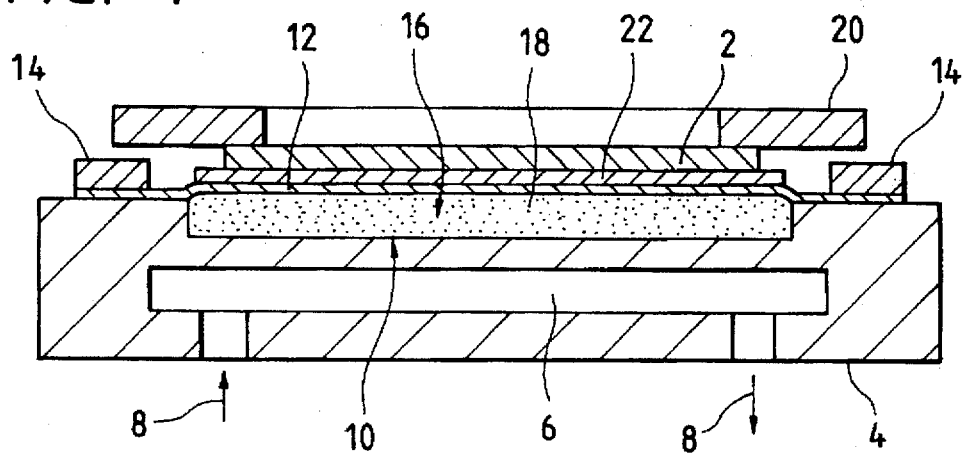
FIG. 1 is a sectional view showing a substrate holding device according to a first embodiment of the invention.

FIG. 1 is a sectional view showing a substrate holding device according to a first embodiment of the invention.

Parts identical with or similar to those in the conventional example previously described are represented by the same reference numerals in FIG. 1. The differences between the first embodiment and the conventional example will primarily be discussed.

In the first embodiment, a sheet-like rubber elastic material 22 is disposed on a sheet 12, and a substrate 2 is mounted to a base 4, whereby rubber elastic material 22 is placed between substrate 2 and sheet 12. Rubber elastic material 22 is made of silicone rubber, fluoro rubber, or a rubber consisting essentially of them, for example. In order to decrease thermal resistance at rubber elastic material 22, preferably rubber elastic material 22 is a material having a high thermal conductivity, for example, 1.5 W/m° C. or more. Rubber elastic material 22 is preferably about 0.1 to 1 mm thick, and more preferably, 0.3 to 0.6 mm thick, so as to decrease its thermal resistance and to maintain its mechanical strength and flexibility.

Preferably, rubber elastic material 22 is about 60–120 hard (JIS-A; the measurement method is according to JIS K 6301), since at a higher hardness, the elasticity decreases and an increase in the contact area cannot be expected.

More specifically, preferably, rubber elastic material 22 comprises a thermal-conductive filler blended with silicone rubber. For example, aluminum oxide, magnesium oxide, boron nitride, aluminum nitride, silicon nitride, etc., can be used as the thermal-conductive filler. In addition, to improve fire retardancy, one or more of aluminum hydroxide, platinum, platinum compound, graphite, etc., may also be added to the thermal-conductive filler. For reinforcement, the thermal-conductive filler may comprise glass cloth mixed in silicone rubber.

Sheet 12 may be a resin sheet made of fluororesin, polyimide, etc., as described above, and preferably is a metal sheet because of the higher thermal-conductivity, mechanical strength, and heat resistance of metal.

Preferably, metal sheet material is stainless metal having excellent mechanical strength, heat resistance, corrosion resistance, etc. In addition, metal sheet may be titanium, molybdenum, tantalum, tungsten, rhenium, indium, etc.

Metal sheet may have a thickness such that when substrate 2 is pressed, the metal sheet becomes deformed and not broken. For example, it may be made in a range of 0.05 to 1 mm thick. However, the thickness of the sheet varies depending on the type of material used. For example, for SUS304, preferably the sheet is 0.1–0.3 mm thick.

Means such as bonding, fusion, and welding can be adopted for fixing the fringes of sheet 12 to base 4, via vacuum sealing. To enhance the fixation strength, these means may be used together with a sheet retainer 14, as shown in FIG. 1.

Preferably, a liquid having high thermal conductivity is used as heat absorbing fluid 18, for example, silicone oil, any other oil, grease, water, mercury, etc., can be used.

Since water, and more specifically pure water, has a higher thermal conductivity and a better cooling capability than the oil family, it is preferably used as heat absorbing fluid 18. However, if the possibility of leakage in a vacuum atmosphere is a concern, then preferably silicone oil, which is resistant to evaporation in a vacuum and a minimally affects other vacuum systems, is used as heat absorbing fluid 18. Preferably, the silicone oil has viscosity 300 cs or less (at 25° C.), for example.

Preferably, the liquid layer thickness of heat absorbing fluid 18 is set to, for example, about 2 to 5 mm so to prevent deformation of sheet 12 and to decrease the thermal resistance in heat absorbing fluid 18 itself.

The material of substrate 2 may be glass, non-alkali glass used for amorphous silicon liquid crystal displays and polycrystalline silicon liquid crystal displays, low alkali glass (borosilicate glass) used for solar cell substrates, silica glass, or low expanded crystalline glass used for polycrystalline silicon color liquid crystal displays, and further may be a semiconductor such as Si or GaAs.

The dimensions and thickness of substrate 2 are not limited. The plane form of substrate 2 can be a rectangle, a circle, or any other form. The plane forms of sheet 12, sealed portion 16, rubber elastic material 22, and substrate retainer 20 may be determined in accordance with the form of substrate 2.

Figure 2:
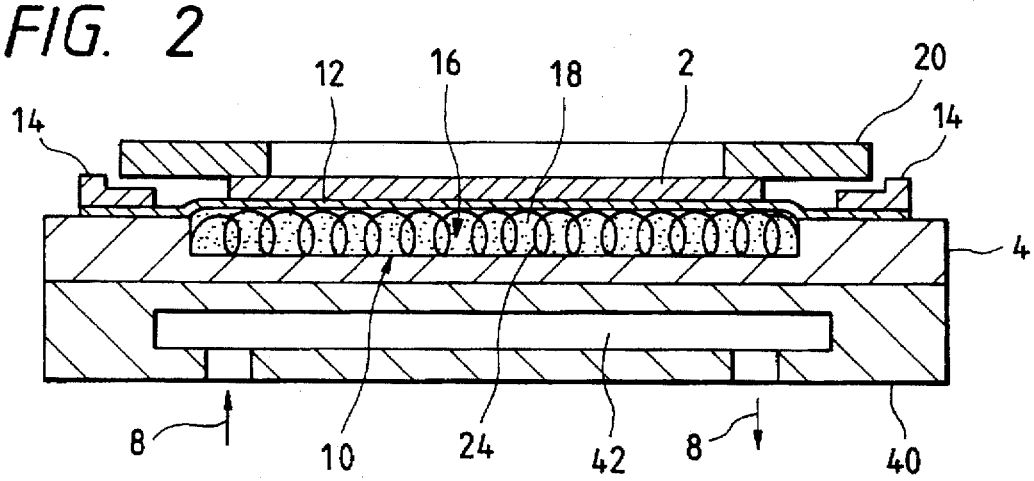
FIG. 2 is a sectional view showing a substrate holding device according to a second embodiment of the invention.

Base 4 may be cooled directly with heat absorbing fluid 18, as shown in FIG. 1, or may be cooled indirectly by locating a metal plate 40, cooled with heat absorbing fluid 18, on the bottom face of base 4, as shown in FIG. 2. Numeral 42 designates a heat absorbing fluid passage in FIG. 2. Heat absorbing fluid 18 is, for example, water, and more specifically pure water or chlorofluorocarbon, etc., as described above. How base 4 is cooled is arbitrary and does not affect the nature of the invention. Base 4 may hold one substrate 2 like a platen or may be a wafer disk for holding a plurality of substrates 2.

Substrate retainer 20 may be annular in accordance with the plane form of substrate 2, or may press the fringes of substrate 2 at a plurality of points.

When treating substrate 2, the substrate holding device normally is used in a vacuum atmosphere, but may be used in any other atmosphere. When the substrate holding device is used in a vacuum atmosphere, the vacuum degree is not limited.

Substrate 2 is treated by, for example, ion implantation, ion doping (ion implantation of non-mass separation type), ion beam irradiation, plasma etching, sputter etching, ion beam etching, electron beam irradiation, etc. The ion and plasma types used are not limited.

Although sheet 12 is brought into intimate contact with the rear face of substrate 2, as in the conventional example, microscopically a large number of small gaps exist between sheet 12 and substrate 2 because of waves, wrinkles, asperities, etc., of sheet 12, and the contact area between them is small. In contrast, if rubber elastic material 22 is put between substrate 2 and sheet 12, it conforms well with both substrate 2 and sheet 12, so that the gaps therebetween are eliminated, the contact area therebetween increases, and accordingly, the thermal resistance between substrate 2 and sheet 12 decreases. Thus, thermal conduction and the terminal conduction between substrate 2 and base 4 are improved, resulting in enhanced cooling capability for substrate 2.

Figure 6:
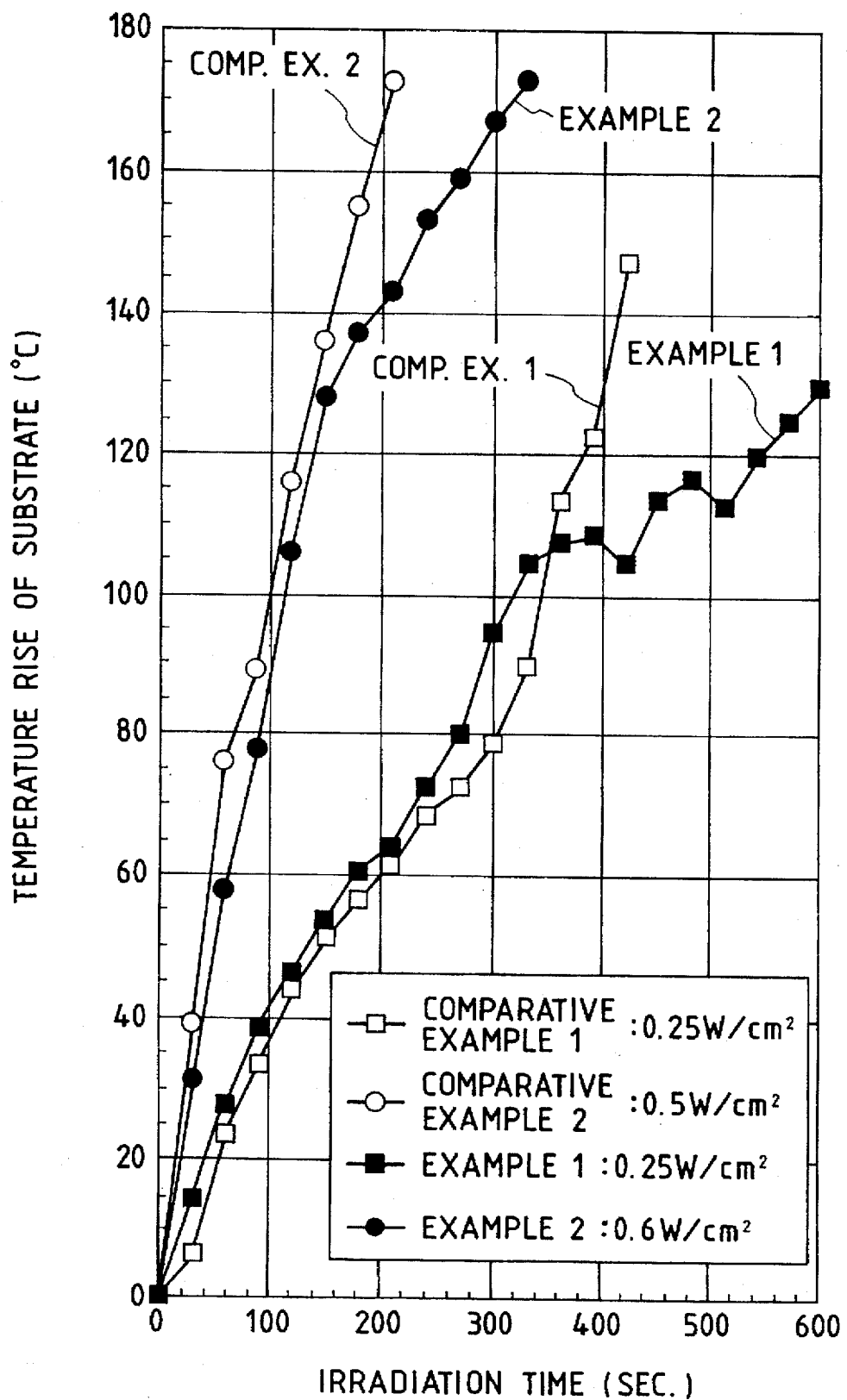
FIG. 6 is a graph showing an example of the measurement results of temperature rise of a substrate.

FIG. 6 shows the measurement results of the temperature rise of substrate 2 when actual ions are implanted into substrate 2 mounted on the substrate holding device shown in FIG. 1.

The measurement conditions are as listed below:

Substrate 2:

Material; Glass 7059 (trade name) manufactured by Corning Co., Ltd.

Dimensions; 300 mm×300 mm×1.1 mm

Rubber elastic material 22:

Material; Silicone rubber TC-45BG (trade name) manufactured by Shin-Etsu Kagaku Kogyo Co., Ltd.

Thickness; 0.45 mm
Hardness; JIS-A 90
Sheet 12:
Material; SU5304
Thickness; 0.1 mm
Heat absorbing fluid 18:
Material; Silicone oil SH200 (trade mark) manufactured by Tore Dow Corning Silicone Co., Ltd.)
Viscosity; 100 cs (at 25° C.)
Liquid layer thickness; 3 mm
Ion beam: Nitrogen ions
Vacuum degree of atmosphere: $4.2 \times 10^{-4}$ Torr In FIG. 6, Examples 1 and 2 are examples in which rubber elastic material 22 is used, as shown in FIG. 1, and input power to substrate 2 by the ion beam in Example 1 is about 0.25 W/cm$^2$ and that in Example 2 is about 0.6 W/cm$^2$. Comparative Examples 1 and 2 are examples in which rubber elastic material 22 is not used, as in the conventional device, and input power to substrate 2 in Comparative Example 1 is about 0.25 w/cm$^2$ and that in Comparative Example 2 is about 0.5 w/cm$^2$. The input power slightly differs between Example 2 and Comparative Example 2 due to variations in adjustment.

When the input power is about 0.25 W/cm$^2$, the temperature of substrate 2 rises almost the same in Example 1 and Comparative Example 1, until about 350 seconds after the irradiation starts. However, after this time, the temperature rise in Example 1 is more moderate than that in Comparative Example 1, and the temperature rise difference between Example 1 and Comparative Example 1 increases with the passage of time.

When the input power is about 0.5 W/cm$^2$, if it is considered that the input power in Example 2 is slightly larger than that in Comparative Example 2, the temperature of substrate 2 rises almost the same amount as in Example 2 and Comparative Example 2, until about 150 seconds after the irradiation starts. However, after this time, the temperature rise in Example 2 is more moderate than that in Comparative Example 2, and the temperature rise difference between Example 2 and Comparative Example 2 increases with the passage of time.

The reason why there is a temperature rise difference between the Examples and the Comparative Examples after a lapse of the reasonable irradiation time, i.e., heating time, is that waves, wrinkles, or asperities of sheet 12 become apparent as substrate 2 is heated. Thus, the thermal conduction in the Comparative Examples, in which no rubber elastic material 21 is used, is reduced.

According to the results, it is seen that rubber elastic material 22 improves the cooling capability for substrate 2.

Substrate 2 may be treated with ion beams, etc., of comparatively large power for a short time or ion beams, etc., of comparatively small power for a long time. Thus, a sufficient effect is produced even if the effect of suppressing the temperature rise of substrate 2 appears after a lapse of the reasonable time as in Examples 1 and 2.

FIG. 2 is a sectional view showing a substrate holding device according to a second embodiment of the present invention. The differences between the second embodiment and the first embodiment shown in FIG. 1 will mainly be discussed. In the second embodiment, in place of rubber elastic material 22, metal elastic members 24 are housed to be distributed almost uniformly in sealed portion 16 between sheet 12 and base 4, and more specifically, in a plane of sealed portion 16. Elastic members 24 come in contact with the faces above and below elastic members 24, i.e., faces of sheet 12 and base 4, at least when substrate 2 is held.

Figure 4:
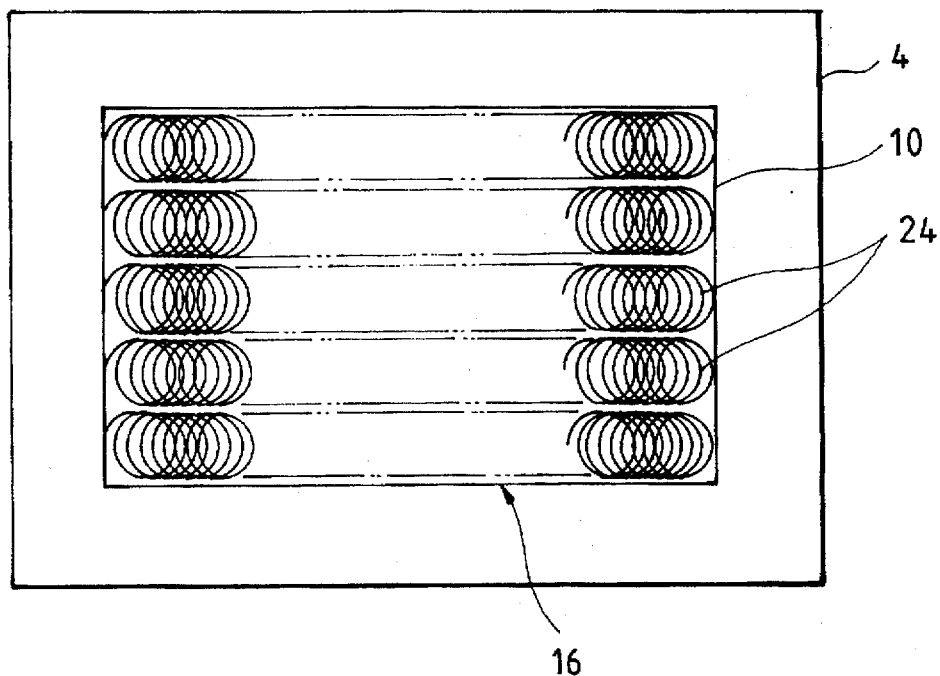
FIG. 4 is a schematic plan view of the distribution state of elastic members in the embodiments shown in FIGS. 2 and 3.

FIG. 4 shows a schematic example of the distribution state of elastic members 24. As shown in FIG. 4, each elastic member 24 is like an elongated coil spring comprising elastic metal small-gage wire, preferably extra-small metal small-gage wire, wound a large number of times like a coil. A plurality of the members are placed side by side almost uniformly in sealed portion 16 so that elastic members 24 can be easily distributed almost uniformly in sealed portion 16.

In addition, elastic members 24 may be a combination of coil-shaped metal small-gage wires, such that they are distributed vertically and horizontally almost uniformly. Elastic members 24 may further comprise metal small-gage wire wound a large number of times in a large number of directions and distributed almost uniformly. Each elastic member 24 may also be like a coil spring having a short axial length (for example, several mm to 10 mm), wherein a plurality of them are made upright and distributed almost uniformly in the plane of sealed portion 16, so as to expand and contract up and down.

Preferably, metal having a high thermal conductivity is used for elastic members 24. More specifically, stainless material which is elastic and has excellent mechanical strength, heat resistance, corrosion resistance, etc., is used for elastic members 24. In addition, an alloy consisting essentially of copper may be used so that a higher thermal conductivity is provided.

Metal elastic members 24 are distributed almost uniformly in sealed portion 16, with heat absorbing fluid 18, (1) since metal has a far higher thermal conductivity than heat absorbing fluid 18, and thus, the thermal conductivity is improved due to the presence of such metal in heat absorbing fluid 18, and moreover, (2) when substrate 2 is pressed against sheet 12, metal elastic members 24 are warped and come in direct contact with the faces above and below them, i.e., the inner face of sheet 12 and the top face of base 4, thus providing thermal conduction via metal elastic members 24. The effects (1) and (2) decrease the heat resistance of heat absorbing fluid 18, and improve the thermal conduction, as well as the terminal conduction between substrate 2 and base 4. Therefore, the cooling capability for substrate 2 is improved.

In the third embodiment, rubber elastic material 22 and metal elastic members 24 described above may be used together, as shown in FIG. 3. Consequently, thermal conduction between base 2 and sheet 12 and heat absorbing fluid 18 below them, is improved. Thus, the thermal conduction between substrate 2 and base 4 is improved, thereby enhancing the cooling capability for substrate 2.

One embodiment of a manufacturing method of the substrate holding device shown in FIG. 2 or 3, particularly the steps of forming sealed portion 16 on base 4 and inserting heat absorbing fluid 18 and elastic members 24 therein, will now be explained.

Figure 5:
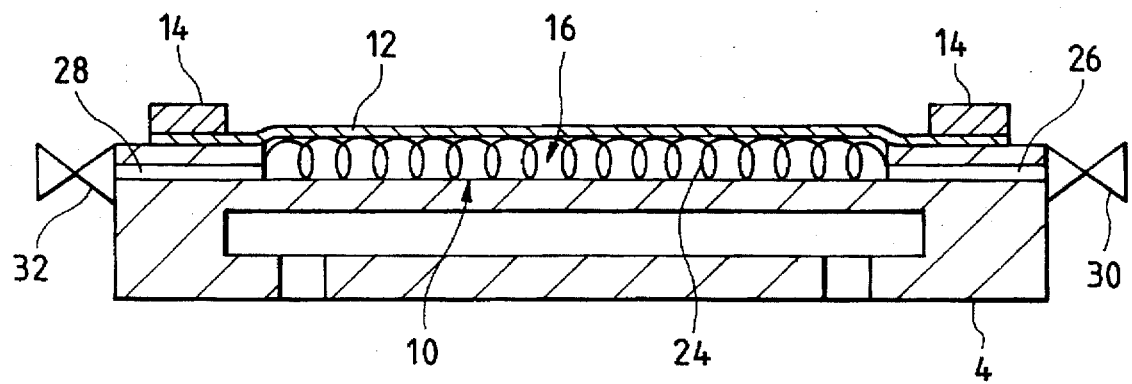
FIG. 5 is a sectional view to explain an example of a manufacturing method of the substrate holding device according to the invention.

In FIG. 5, first, elastic members 24 are placed on base 4, or, more specifically, on a recess 10 in the surface of the base. Recess 10, in which elastic members 24 are placed, is covered with sheet 12. Then, the fringes of sheet 12 are fixed to and sealed in base 4 to form sealed portion 16 therein.

Next, sealed portion 16 is evacuated through a suction port 26 formed in base 4. After the evacuation is continued for a predetermined time, and while the evacuation is continued, the previously deaerated heat absorbing fluid 18 is injected into sealed portion 16 through an injection port 26 formed in base 4 to fill the region with heat absorbing fluid 18. Finally, suction port 26 and injection port 28 are closed. Specifically, valves 30 and 32 leading to suction port 26 and injection port 28, respectively, are closed.

According to the manufacturing method, sealed portion 16 can be easily formed on base 4, and elastic members 24 can be housed in the region filled with heat absorbing fluid 18.

When the substrate holding device shown in FIG. 1 is manufactured, the step of placing elastic members 24 may be omitted from the manufacturing method described above. That is, sheet 12 is placed over recess 10 in the surface of base 4, the fringes of sheet 12 are fixed to and sealed in base 4, and sealed portion 16 is formed therein.

Next, sealed portion 16 is evacuated through a suction port 26. After the evacuation is continued for the required time, and while the evacuation is continued, the previously deaerated heat absorbing fluid 16 is injected into sealed portion 16 through an injection port 28 to fill the region with heat absorbing fluid 18. Suction port 26 and injection port 28 are subsequently closed. According to this manufacturing method, sealed portion 16 can be easily formed on base 4 and be easily filled with heat absorbing fluid 18.

Figure 7:
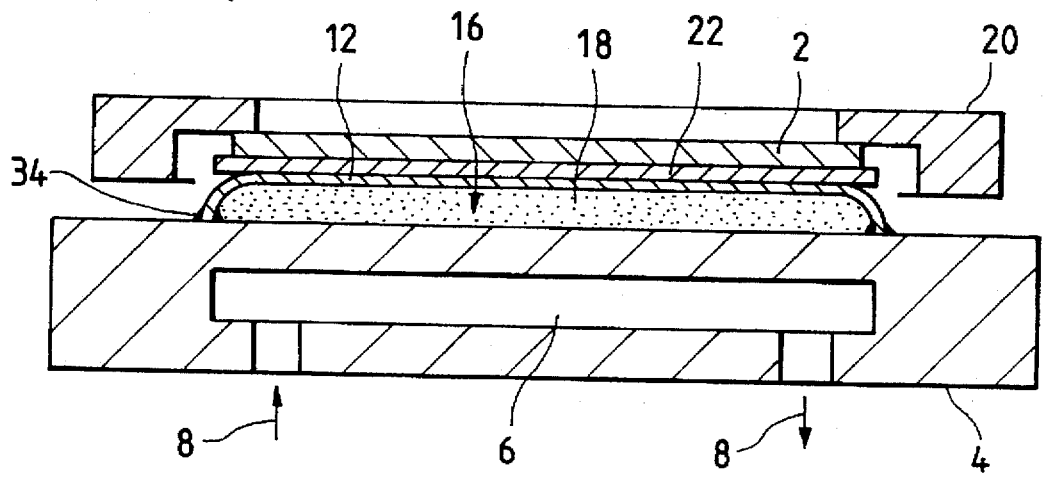
FIG. 7 is a sectional view showing a substrate holding device according to a fourth embodiment of the invention.
Figure 8:
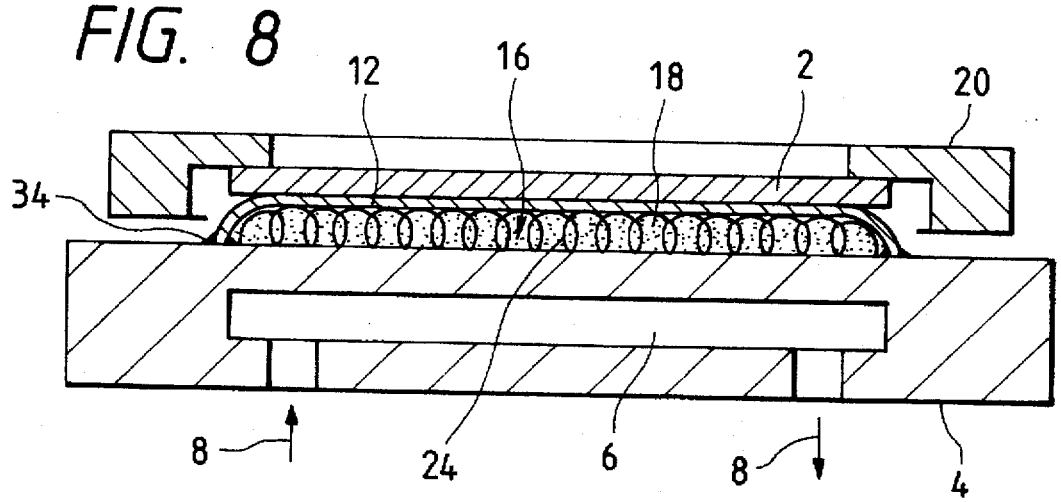
FIG. 8 is a sectional view showing a substrate holding device according to a fifth embodiment of the invention.
Figure 9:
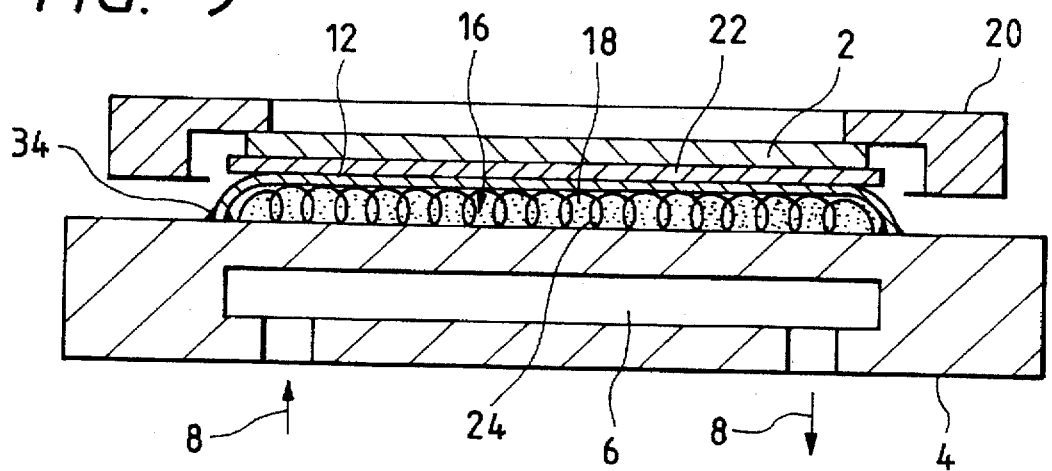
FIG. 9 is a sectional view showing a substrate holding device according to a sixth embodiment of the invention.

The surface of base 4 need not necessarily be formed with recess 10. FIGS. 7 to 9 show fourth to sixth embodiments wherein recess 10 is not formed. These embodiments correspond to the first to third embodiments shown in FIGS. 1 to 3, respectively. The differences therebetween will primarily be discussed. In the fourth to sixth embodiments, sheet 12 is extended on the flat surface of base 4. A margin between sheet 12 and base 4 and the fringes of sheet 12 are fixed to the surface of base 4, thereby forming a sealed portion between sheet 12 and base 4. Numeral 34 represents the fixation part. The method employed for fixing sheet 12 is, for example, bonding, fusion, welding, etc. Sealed portion 16 is filled with heat absorbing fluid 18, as described above. When sealed portion 16 is filled with heat absorbing fluid 18 to provide a proper pressure, sheet 12 swells and when substrate 2 is mounted, the swell remains to some extent.

In the embodiment shown in FIG. 7, rubber elastic material 22, as described above, is placed on sheet 12. In the embodiment shown in FIG. 8, metal elastic members 24, as described above, are housed in sealed portion 16 so to be distributed almost uniformly. In the embodiment shown in FIG. 9, rubber elastic material 22 and elastic members 24 are used together. An example of the distribution state of elastic members 24 is similar to that shown above in FIG. 4.

Figure 3:
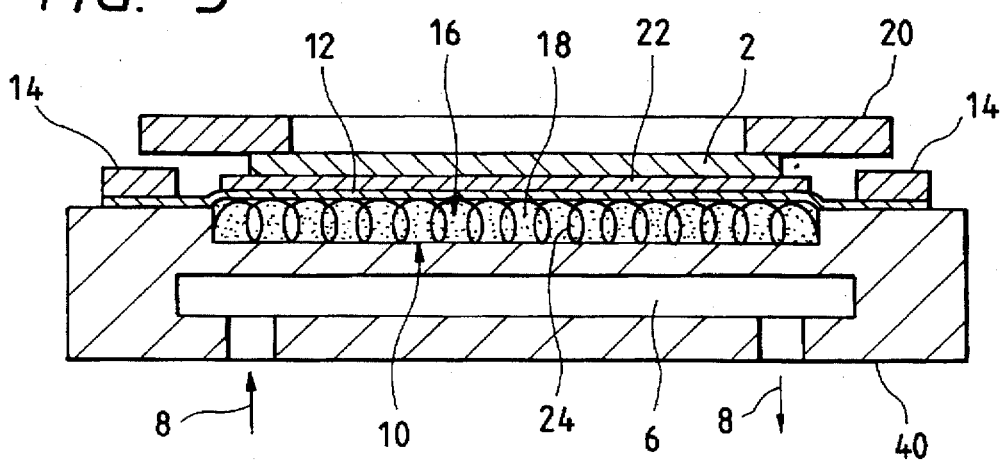
FIG. 3 is a sectional view showing a substrate holding device according to a third embodiment of the invention.

In the embodiments shown in FIGS. 7 to 9, similar effects to those discussed in the embodiments shown in FIGS. 1 to 3 can also be produced.

Figure 11:
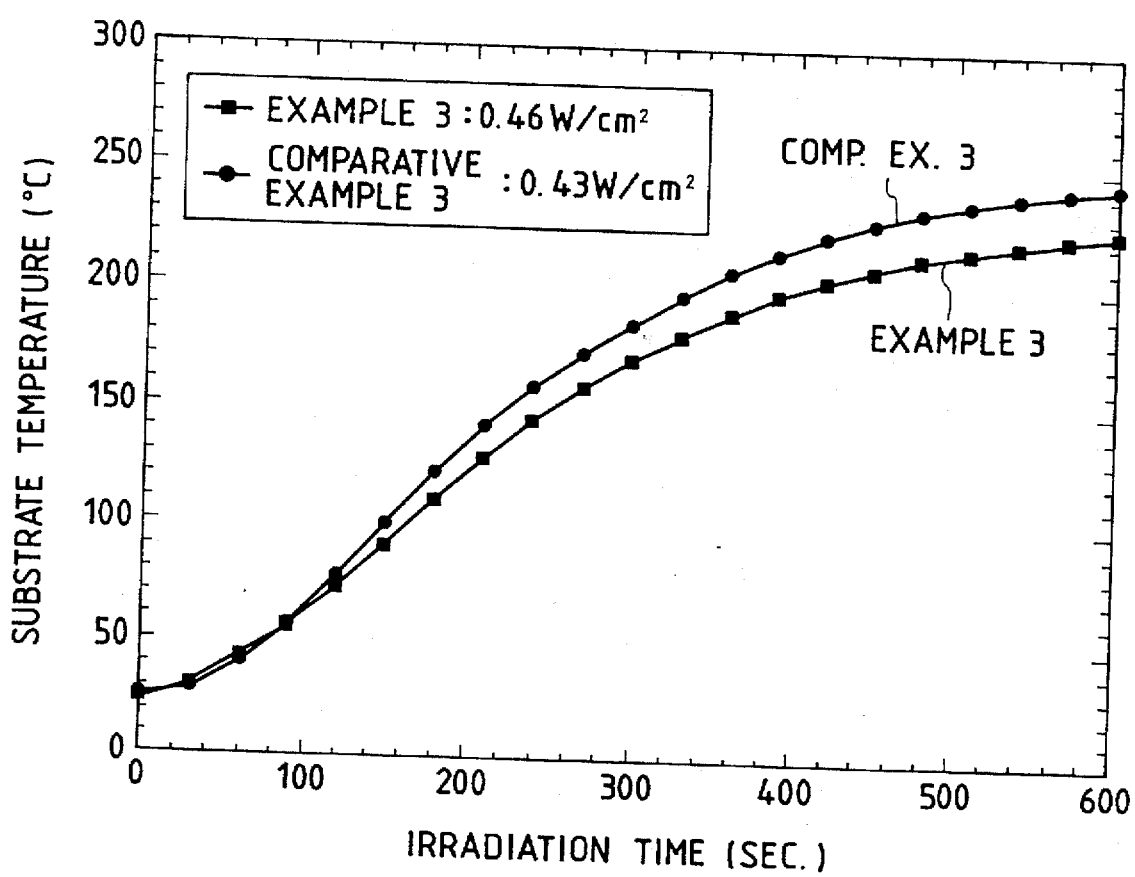
FIG. 11 is a graph showing another example of the measurement results of temperature rise of a substrate.

FIG. 11 shows the measurement results of the temperature rise of substrate 2 when substrate 2 is actually doped with ions using the substrate holding device shown in rig. 8. The measurement conditions are as listed below:

Substrate 2: Glass substrate
Sheet 12:
Material; SUS304
Thickness; 0.1 mm
Heat absorbing fluid 18:
Material; Silicone oil
Liquid layer thickness; 2 mm
Elastic member 24:
Material; SUS304
Form; Coil spring In FIG. 11, Example 3 is an example in which elastic members 24 are provided as shown in FIG. 8 and input power to substrate 2 by an ion beam is about 0.46 W/cm$^2$. Comparative Example 3 is an example in which elastic members 24 are not provided and input power to substrate 2 is about 0.43 W/cm$^2$. The input power slightly differs between Example 3 and Comparative Example 3 due to variations in adjustment.

The temperature of substrate 2 is almost the same in Example 3 and Comparative Example 3 until about 100 seconds after irradiation by the ion beam starts. However, after this time, the temperature rise in Example 3 is more moderate than that in Comparative Example 3, and the temperature difference between Example 3 and Comparative Example 3 increases with the passage of time and reaches not less than about 20° C. According to the results, it can be seen that elastic members 24 improve the cooling capability for substrate 2.

One embodiment of a manufacturing method of the substrate holding device shown in FIG. 8 or 9, particularly, the steps of forming a sealed portion 16 on base 4 and inserting heat absorbing fluid 16 and elastic members 24 therein, is explained as follows.

Figure 10:
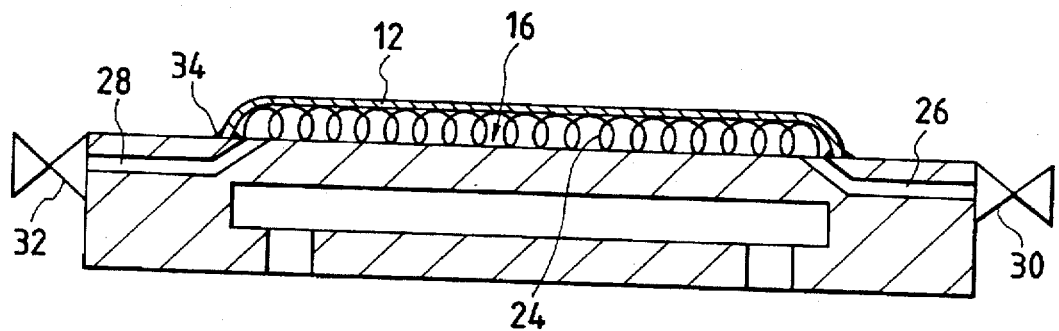
FIG. 10 is a sectional view to explain another example of the manufacturing method of the substrate holding device according to the invention.

In FIG. 10, elastic members 24 are placed on base 4 and covered with sheet 12, the fringes of sheet 12 are fixed to and sealed in base 4, and sealed portion 16 is formed therein.

Next, sealed portion 16 is evacuated through a suction port 26 made in base 4. After the evacuation is continued for the required time, and while the evacuation is continued, the previously deaerated heat absorbing fluid 16 is injected into sealed portion 16 through an injection port 28 made in base 4 to fill the region with heat absorbing fluid 18. Suction port 26 and injection port 28 are subsequently closed. Specifically, in this example, valves 30 and 32 leading to suction port 26 and injection port 28, respectively, are closed.

According to the manufacturing method, sealed portion 16 can be easily formed on base 4 and elastic members 24 can be housed in the region filled with heat absorbing fluid 18.

In method of manufacturing the substrate holding device shown in FIG. 7, the step of placing elastic members 24 may be omitted, as described above. That is, sheet 12 is placed on base 4, the fringes of sheet 12 are fixed to and sealed in base 4, and sealed portion 16 is formed therein.

Next, sealed portion 16 is evacuated through a suction port 26. After the evacuation is continued for the required time, and while the evacuation is continued, the previously deaerated heat absorbing fluid 16 is injected into sealed portion 16 through an injection port 28 to fill the region with heat absorbing fluid 16. Suction port 26 and the infection port 28 are subsequently closed. According to this manufacturing method, sealed portion 16 can be easily be formed on base 4 and be filled with heat absorbing fluid 18.

Figure 12:
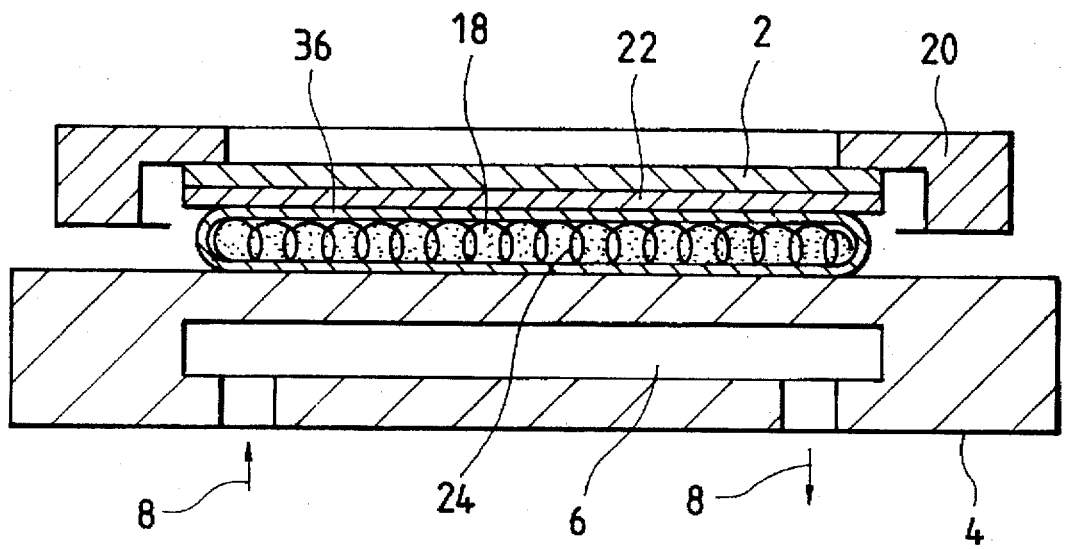
FIG. 12 is a sectional view showing a substrate holding device according to a seventh embodiment of the invention.
Figure 13:
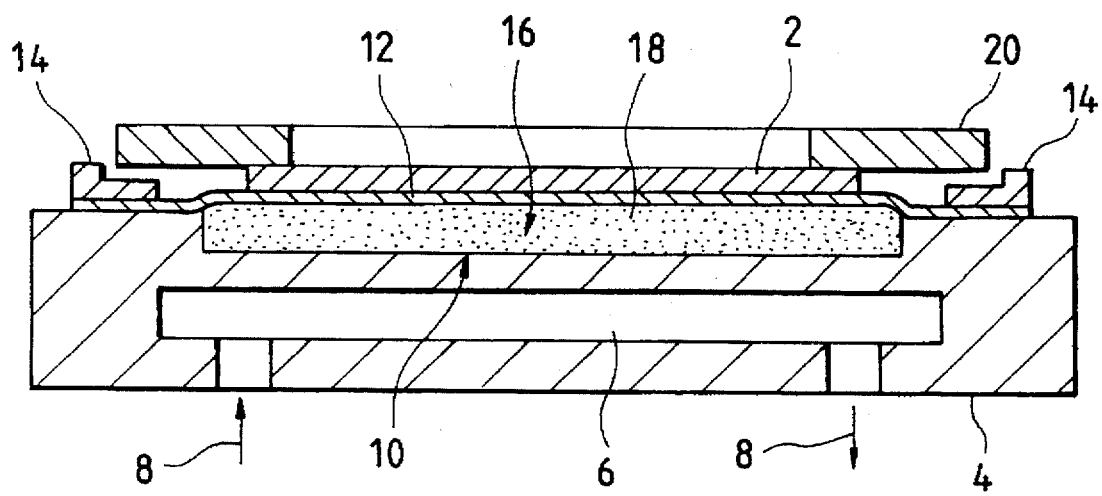
FIG. 13 is a sectional view showing an example of a conventional substrate holding device.

In another embodiment of the present invention, a bladder filled with heat absorbing fluid 18 may be disposed on base 4, and the sealed portion therebetween is filled with heat absorbing fluid 16. FIG. 12 shows such an embodiment as a seventh embodiment of the invention. The seventh embodiment corresponds to the embodiments shown in FIGS. 3 and 9. The differences therebetween will primarily be discussed. In the seventh embodiment, a sealed bladder 36 made of a flexible sheet is disposed on base 4, and is filled with heat absorbing fluid 18. In the embodiment, metal elastic members 24 are housed almost uniformly in bladder 36, and more specifically, are housed so as to be distributed almost uniformly in the plane of bladder 36. Further, in the embodiment, rubber elastic material 22 is disposed on bladder 36 and substrate 2 is pressed against base 4 by substrate retainer 20, thereby putting rubber elastic material 22 and bladder 36 between substrate 2 and base 4.

Preferred examples of the material, thickness, etc., of the sheet forming bladder 36 are similar to those of sheet 12.

Preferred examples of the material and liquid layer thickness of heat absorbing fluid 18, the material and thickness of rubber elastic material 22, and the material, form, layout, etc., of elastic members 24 are also as described above.

To house heat absorbing fluid 18 and elastic members 24 in bladder 36, for example, an opening is made in bladder 36, and elastic members 24 are inserted through the opening. Further, the previously deaerated heat absorbing fluid 16 is injected into bladder 36 and the opening is sealed. Preferably, bladder 36 is fixed on base 4 with an adhesive, etc., to prevent slippage on base 4.

The seventh embodiment produces the effects substantially similar to those discussed above in the embodiments shown in FIGS. 3 and 9.

That is, when substrate 2 is held, heat absorbing fluid 18 in bladder 36 becomes deformed and provides an isotropic pressure. As a result, heat absorbing fluid 18 becomes uniformly thick in the plane of substrate 2, and thereby provides even cooling capability.

Since the surface of bladder 36 becomes deformed in response to asperities of substrate 2 and base 4, the contact area with their faces is improved, providing a large cooling capability.

Moreover, if rubber elastic material 22 is put between substrate 2 and bladder 36, it conforms well with both substrate 2 and bladder 36. Accordingly, the gaps therebetween are filled, the contact area therebetween increases, and the thermal resistance between substrate 2 and bladder 36 decreases. This improves thermal conduction, and in turn, improves the terminal conduction between substrate 2 and base 4. As a result, the cooling capability for substrate 2 is improved.

Further, if metal elastic members 24 are distributed almost uniformly in bladder 36, with heat absorbing fluid 18, then: (1) since metal has a far higher thermal conductivity than heat absorbing fluid 18, the thermal conductivity is improved when heat absorbing fluid 18 engages the metal, and moreover, (2) when substrate 2 is mounted against bladder 36, etc., metal elastic members 24 are warped and come in direct contact with the faces above and below them, i.e., the top and bottom faces of bladder 36, thus providing thermal conduction. Effects (1) and (2) decrease the heat resistance of heat absorbing fluid 18 so to improve thermal conduction, which in turn, improves the terminal conduction between substrate 2 and base 4, and enhances the cooling capability for substrate 2.

Although the cooling capability is greatly improved by installing both rubber elastic material 22 and elastic members 24, only either of them may be installed. That is, only rubber elastic material 22 may be installed without elastic members 24, in which case the structure corresponds to that shown in FIG. 1 or 7. In this case, the above-mentioned effect produced by installing rubber elastic material 22 is produced. Alternatively, elastic members 24 may be installed without rubber elastic material 22, in which case the structure corresponds to that shown in FIG. 2 or 8. In this case, the above-mentioned effect produced by installing elastic members 24 is produced.

According to the substrate holding device, since the sheet-like rubber elastic material is disposed on the sheet sealing the heat absorbing fluid, and is between the substrate and the sheet, it conforms well with both the substrate and the sheet, such that the gaps therebetween are filled and the contact area therebetween increases. The thermal conduction between the substrate and the sheet is improved, and in turn, the terminal conduction between the substrate and the base is improved, as well as the cooling capability for the substrate.

Further, according to the substrate holding device, the metal elastic members are housed so as to be distributed almost uniformly in the sealed portion, and metal has a far higher thermal conductivity than the heat absorbing fluid alone. The thermal conductivity is improved due to the heat absorbing fluid being in the presence of the metal. Moreover, when a substrate is pressed against the sheet, etc., the metal elastic members are warped and come into direct contact with the faces above and below them, i.e., the inner face of the sheet and the top face of the base, thus providing thermal conduction via the metal elastic members. These two effects improve the thermal conduction in the heat absorbing fluid, and in turn, improve the terminal conduction between the substrate and the base. The result being that the cooling capability for the substrate improved.

Still further, according to the substrate holding device, since the rubber elastic material and the metal elastic members are used together, both the thermal conduction between the substrate and the sheet and that in the heat absorbing fluid below them, are improved. Therefore, the thermal conduction between the substrate and the base is improved, enhancing the cooling capability for the substrate.

Even still further, according to the substrate holding device, since the sheet-like rubber elastic material is disposed on the bladder filled with a heat absorbing fluid and is put between the substrate and the bladder, it conforms well with both the substrate and the bladder, so that the gaps therebetween are filled and the contact area therebetween increases. Thus, the thermal conduction between the substrate and the bladder, the terminal conduction between the substrate and the base, and, accordingly, the cooling capability for the substrate, are improved.

Also, according to the substrate holding device, since the metal elastic members are housed so as to be distributed almost uniformly in the bladder filled with a heat absorbing fluid, and metal has a far higher thermal conductivity than the heat absorbing fluid, the thermal conductivity is improved due to the heat absorbing fluid being in the presence of such metal. Moreover, when a substrate is pressed against the bladder, etc., the metal elastic members are warped and come in direct contact with the faces above and below them, namely, the top and bottom faces of the bladder, thus providing thermal conduction via the metal elastic members. These two effects improve the thermal conduction in the heat absorbing fluid, and in turn, improve the terminal conduction between the substrate and the base. Therefore, the cooling capability for the substrate is improved.

Further, according to the substrate holding device, since the rubber elastic material and the metal elastic members are used together, both the thermal conduction between the substrate and the bladder, and the heat absorbing fluid below them, are improved. The thermal conduction between the substrate and the base is thus improved, enhancing the cooling capability for the substrate.

Finally, according to the substrate holding device, the metal elastic members, each of which comprises elastic metal small-gage wire wound a large number of times like a coil, can be easily distributed almost uniformly in the sealed portion or the bladder.

According to the manufacturing method, a sealed portion can be easily formed on the base and filled with a heat absorbing fluid.

Further according to the manufacturing method, a sealed portion can be easily formed on the base and the elastic members can be housed therein and the sealed portion can be filled with a heat absorbing fluid.

What is claimed is:

1. A substrate holding device, comprising:
   a base for holding a substrate;
   a sealed portion provided on said base, at least part of said seated portion being flexible;
   a heat absorbing fluid filling said sealed portion;
   a sheet-shaped rubber elastic material being disposed on said sealed portion; and
   a substrate retainer for pressing fringes of said substrate placed on said substrate holding device against said base.

2. A substrate holding device according to claim 1, further comprising a flexible sheet whose fringe is extended on a surface of said base to form said sealed portion between said sheet and said base.

3. A substrate holding device according to claim 2 further comprising metal elastic members being housed to be distributed substantially uniformly in said sealed portion.

4. A substrate holding device according to claim 3, wherein said elastic members comprise elastic metal small-gage wire wound a large number of times like a coil and a plurality of said members are placed side by side substantially uniformly.

5. A substrate holding device according to claim 1, wherein said sheet-shaped rubber elastic substance has a thermal conductivity equal to 1.5 W/m° C. or more.

6. A substrate holding device according to claim 1, wherein said sheet-shaped rubber elastic substance has a thickness in a range of 0.1 mm to 1.0 mm.

7. A substrate holding device according to claim 6, wherein said sheet-shaped rubber elastic substance has a thickness in a range of 0.3 mm to 0.6 mm.

8. A substrate holding device according to claim 1, wherein said sheet-shaped rubber elastic substance has a hardness in a range of 60 to 120 (JIS-A; the measurement method is according to JIS K 6301).

9. A substrate holding device according to claim 1, further comprising metal elastic members being housed to be distributed substantially uniformly in said sealed portion.

10. A substrate holding device according to claim 9, wherein said elastic members comprise elastic metal small-gage wire wound a large number of times like a coil and a plurality of said members are placed side by side substantially uniformly.

11. A substrate holding device according to claim 1, further comprising a flexible bladder to form said sealed portion.

12. A substrate holding device according to claim 11, further comprising metal elastic members being housed to be distributed substantially uniformly in said bladder.

13. A substrate holding device according to claim 12, wherein said elastic members comprise elastic metal small-gage wire wound a large number of times like a coil and a plurality of said members are placed side by side substantially uniformly.

14. A substrate holding device, comprising:
    a base for holding a substrate;
    a sealed portion provided on said base, at least part of said sealed portion being flexible;
    a heat absorbing fluid filling said sealed portion;
    a sheet-shaped rubber elastic material disposed on said sealed portion;
    metal elastic members being housed to be distributed substantially uniformly in said sealed portion; and
    a substrate retainer for pressing fringes of said substrate placed on said substrate holding device against said base.

15. A substrate holding device according to claim 14, further comprising a flexible bladder to form said sealed portion.

16. A method of manufacturing a substrate holding device, comprising the steps of:
    placing a sheet on a base for holding a substrate;
    fixing fringes of said sheet to said base to form a sealed portion therein;
    while evacuating said sealed portion through a suction port formed in said base, injecting a previously deaerated heat absorbing fluid into said sealed portion through an injection port formed in said base to fill said sealed portion with said heat absorbing fluid;
    closing said suction port and said injection port; and
    fixing a rubber elastic material on said sheet in contact with said substrate.

17. A method according to claim 16, further comprising the step of placing metal elastic members on said base, said metal elastic members covered with said sheet.

* * * * *

UNITED STATES PATENT AND TRADEMARK OFFICE
CERTIFICATE OF CORRECTION

PATENT NO.  : 5,685,363
DATED       : November 11, 1997
INVENTOR(S) : Koichi ORIHIRA et al.

It is certified that error appears in the above-indentified patent and that said Letters Patent is hereby corrected as shown below:

In claim 1, Column 11, line 5, "seated" should read --sealed--.

Signed and Sealed this

Twenty-first Day of April, 1998

Attest:

BRUCE LEHMAN

Attesting Officer

Commissioner of Patents and Trademarks